United States Patent
Hsu

[11] Patent Number: 5,985,723
[45] Date of Patent: Nov. 16, 1999

[54] ROM CODING BY NEURON ACTIVATION

[75] Inventor: Chih-Hau Hsu, Hsinchu, Taiwan

[73] Assignee: Utek Semiconductor Corp., Taiwan

[21] Appl. No.: 09/070,924

[22] Filed: May 1, 1998

[30] Foreign Application Priority Data

Jan. 5, 1998 [TW] Taiwan ............................ 87100092

[51] Int. Cl.⁶ .................................................. H01L 21/8246
[52] U.S. Cl. ........................... 438/278; 438/798; 438/515
[58] Field of Search .................................... 438/130, 275, 438/276, 277, 278, 515, 798, 904

[56] References Cited

U.S. PATENT DOCUMENTS 4,684,413  8/1987  Goodman et al. ...................... 438/798
5,196,354  3/1993  Ohtaka et al. .......................... 438/798
5,429,974  7/1995  Hsue et al. ............................. 438/278

Primary Examiner—Chandra Chaudhari

[57] ABSTRACT

A process for ROM coding is described. First, the active device areas and isolation regions are defined on a semiconductor substrate. Then, silicon isotopes ($Si^{30}$) are implanted into the active device areas to form isotope regions. Next, the remaining portions of the MOSFET structures are then formed. Next, an interlayer dielectric layer, and a metal layer are sequentially deposited and patterned to finish the basic ROM structure. Upon the receipt of an order, a passivation layer is deposited overlaying the interlayer dielectric layer. Next, a photoresist layer is coated over the passivation layer, and code implant windows are patterned. Finally, neutron irradiation is performed to activate the silicon isotopes into N-type phosphorus ions.

18 Claims, 5 Drawing Sheets

ROM CODING BY NEURON ACTIVATION

BACKGROUND OF THE INVENTION

(1) Field of the Invention

This invention relates generally to the field of read only memory (ROM) fabrication, and more particularly, to a ROM coding process during ROM manufacturing.

(2) Description of the Prior Art

ROM devices are standard components of modern computer and electronic systems. A ROM cell comprises an array of metal oxide semiconductor field effect transistors (MOSFETs) arranged in columns and rows. These MOSFETs are either normally on or normally off to represent a function code of the ROM. The alternative on/off operation of these devices states of the MOSFETs is adopted to use for storage of data, which remains in the device when the external power supply is off.

At the intersection of horizontal conductive lines in the array are commonly referred as "wordline", while the vertical conductive lines in the array are commonly referred as "bitline". Referring now more particularly to FIG. 1, there is shown a example circuit diagram representation of a typical ROM array comprising two bitlines $BL_1$, $BL_2$ and three wordlines $WL_1$, $WL_2$, $WL_3$ that are made of NMOSs. The enhancement mode transistor $M_{11}$ which is represented address (11) is non-conductive when wordline $WL_1$ is selected (that is $WL_1$ low and $WL_2$, $WL_3$ high), therefore, the output of bitline $BL_1$ is 0. On the other hand, the depletion mode transistor $M_{12}$ is conductive when wordline $WL_1$ is selected, therefore, the output of bitline $BL_2$ is 1. That is, the outputs of $BL_1$, $BL_2$ is (0,1). Similarly, the outputs of $BL_1$, $BL_2$ is (1,0) when wordline $WL_2$ is low ($WL_1$, $WL_3$ are high). Again, the outputs of $BL_1$, $BL_2$ would be (0,0) when wordline $WL_3$ is low ($WL_1$, $WL_2$ are high). A set of (0,1), (1,0) and (0,0) codes are pre-stored in the ROM array as shown in FIG. 1. The conductive status of the transistors determine the functions of a specific ROM array. These codes are placed in the semiconductor substrate via code implanting to provide predefined binary data of the ROMs.

Conventionally, the code implantation is performed at a very early stage because of process limitation. Since the ions (impurities) cannot penetrate thicker layers, code implantation is performed before the dielectric layer is formed. Subsequent process steps such as dielectric layer and metal layer deposition, annealing, and passivation layer deposition are still needed to complete the ROM manufacture. Therefore, long turn around time is required and is not suitable for flexible business competitions.

There are many ways to deal with this problem with later stage code implanting. U.S. Pat. No. 5,429,974 to Hsue et al. of United Microelectronics Corporation, Taiwan (the entire disclosure of which is herein incorporated by reference) provides a code implanting process after final passivation layer is formed. However, thinner final passivation layer is required for this approach that may degrade the ROM performance. Besides, post-implant activating step may damage the metal layer.

This invention reveals an improved ROM coding process to eliminate above mentioned problems. Neutron irradiation is described in the article entitled "Phosphorus doping silicon by means of neutron irradiation" by Hass et al., IEEE Transactions on Electron Devices, Vol. ED-23, No. 8, August 1976, pp. 803–805, which is fully incorporated by reference.

SUMMARY OF THE INVENTION

Accordingly, it is a primary object of the present invention to provide a ROM coding process which implants codes after final passivation that can cut down turn around time tremendously.

It is another object of the present invention to provide a ROM coding process by means of neutron irradiation to transform silicon isotopes into phosphorus ions, and therefore, achieves ROM coding.

Yet, another object of the present invention is to provide a ROM coding process which implants silicon isotopes first to further enhance the effect of coding.

It is a further object of the present invention to provide an easy and manufacturable ROM coding process without the requirement of a thinner passivation layer.

It is a still further object of the present invention to provide an easy and manufacturable ROM coding process by means of neutron irradiation without crystal damage to reduce the activation anneal temperature.

These objects are accomplished by the fabrication process described below.

First, the active device areas and isolation regions are defined on a semiconductor substrate. Then, silicon isotopes ($Si^{30}$) are implanted into the active device areas to form isotope regions. Next, a gate oxide layer and a polysilicon (or polycide) layer are sequentially formed on the semiconductor substrate. The gate oxide layer and polysilicon layer are then patterned to define wordlines and gates of the periphery devices. Next, $N^-$ lightly doped drains (NLDD)/PLDD regions, spacers, and $N^+/P^+$ source/drain regions of the MOSFETs are then formed. Next, an interlayer dielectric (ILD) layer is deposited over the entire semiconductor substrate. Thereafter, the dielectric layer is planarized. Then, contact windows are defined and a metal layer is deposited and patterned. Finally, a passivation layer is deposited overlaying the interlayer dielectric layer to finish the basic ROM structure. These raw ROMs are stored in so-called passivation bank.

Upon the receipt of an order, a photoresist layer is coated over the passivation layer, and code implant windows are patterned by the conventional lithography techniques. Finally, neutron irradiation is performed to activate the silicon isotopes into N-type phosphorus ions. The MOSFETs are then transferred to their a specific conductive or non-conductive status that achieves the code implanting. The easy and time saving ROM coding process according to the present invention is accomplished.

BRIEF DESCRIPTION OF THE DRAWINGS

The accompanying drawings forming a material part of this description, in which.

DESCRIPTION OF THE PREFERRED EMBODIMENTS

Figure 1:
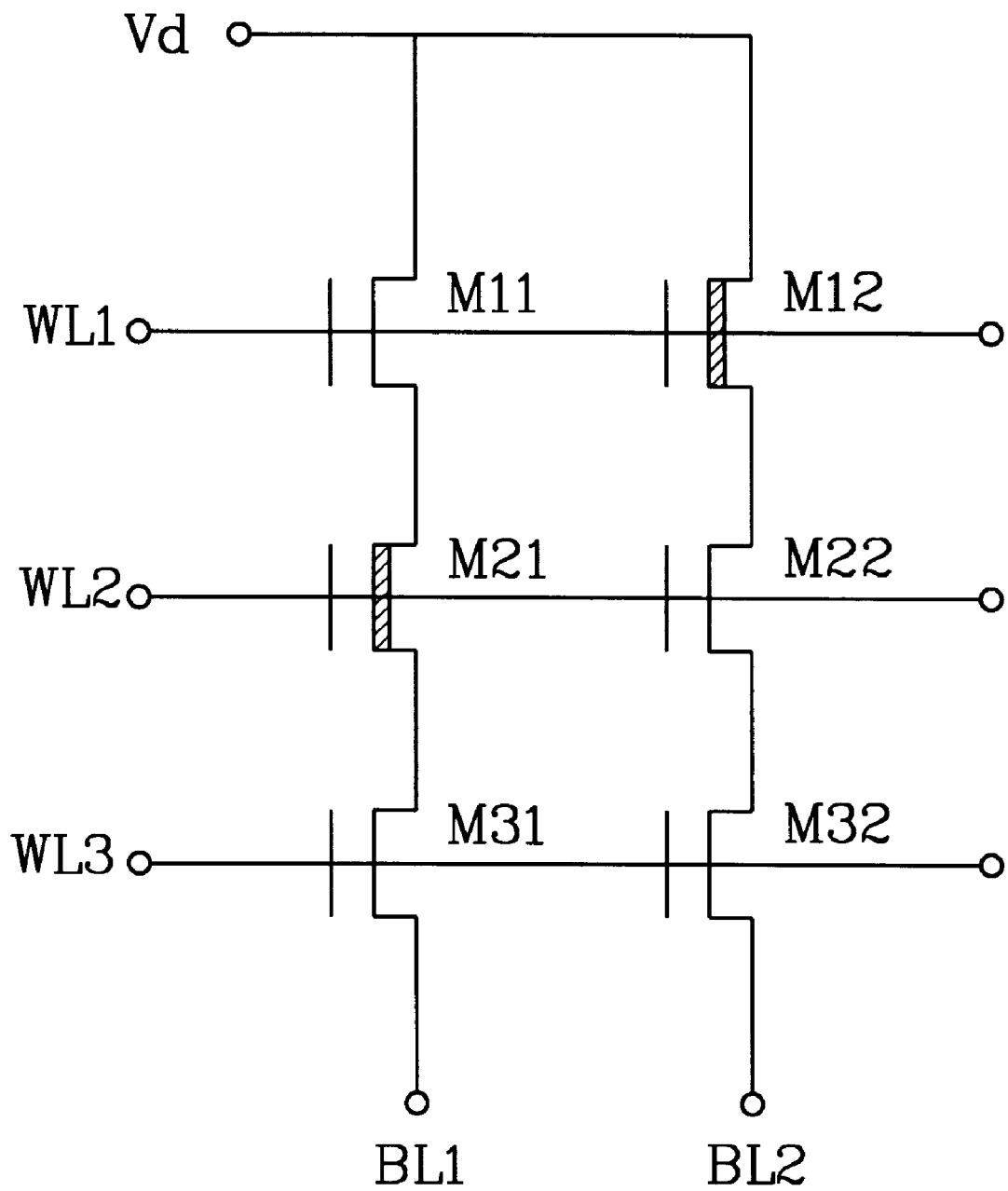
FIG. 1 shows a example circuit diagram representation of a typical ROM array.

The invention discloses herein is directed to a ROM coding process during ROM manufacturing. The drawing figures are illustrated a partially completed semiconductor substrate. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

Figure 2:
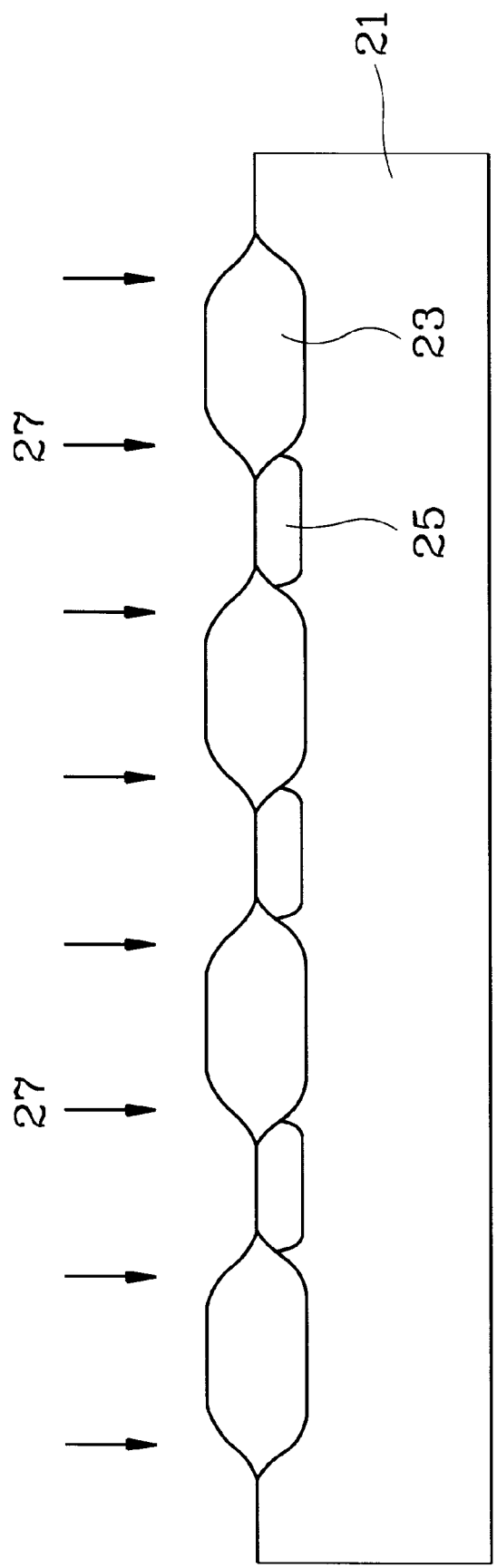
FIG. 2 shows a cross sectional representation of a substrate after the silicon isotope regions are formed according to the present invention.

Referring now more particularly to FIG. 2, the starting material of the present invention is a monocrystalline P-type semiconductor substrate 21 such as a silicon wafer. First, a P-well and an N-well (not shown in the Figures) are formed in the semiconductor substrate 21. Next, the active device areas and isolation regions 23 are defined. Then, silicon isotopes ($Si^{30}$) 27 are implanted into the active device areas to form isotope regions 25 as shown in FIG. 2.

The P-well is formed by ion-implanting P-type impurities which are preferably using boron ($B^{11}$) ions, at an energy of 30 to 100 keV, and a dose between about 1E13 to 3E13 $cm^{-2}$. The N-well is also formed by ion-implanting N-type impurities which are preferably using phosphorus ($P^{31}$) ions, at an energy of 30 to 100 keV, and a dose between about 5E12 to 1.5E13 $cm^{-2}$. The isolation regions 23 are filed oxides formed by thermal oxidation to a thickness of about 3000 to 6500 Angstroms. The silicon isotopes ($Si^{30}$) 27 implantation is one of the key points of the present invention, that are implanted silicon isotopes at an energy of between 20 to 150 keV, and a dose between about 1E12 to 1E15 $cm^{-2}$. If the intrinsic silicon isotope concentration in the semiconductor substrate 21 is high enough, this silicon isotopes implantation step may be omitted.

Figure 3A:
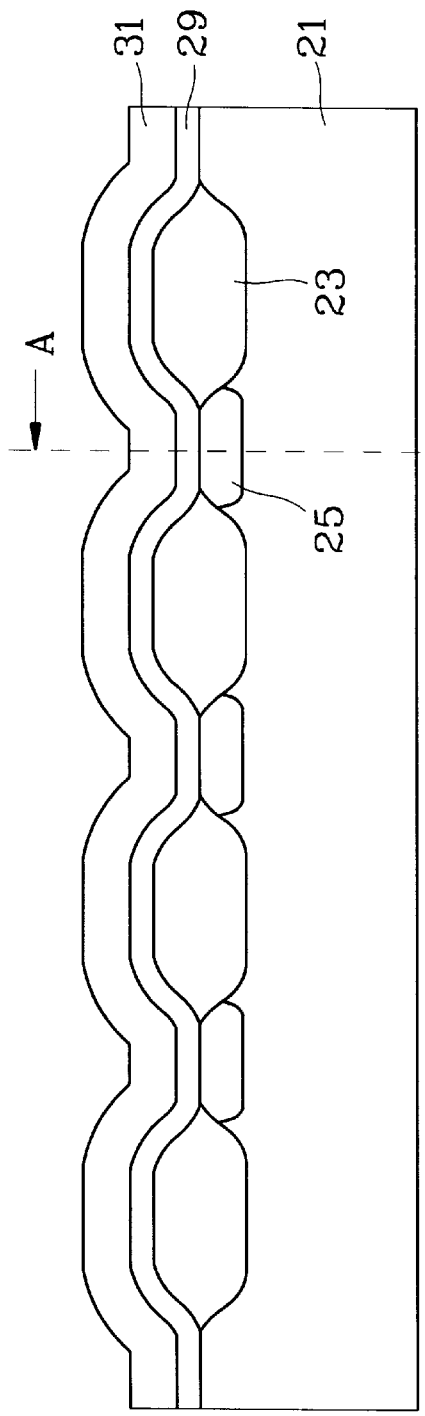
FIG. 3A shows a cross sectional representation of a substrate after the passivation layer is formed according to the present invention.
Figure 3B:
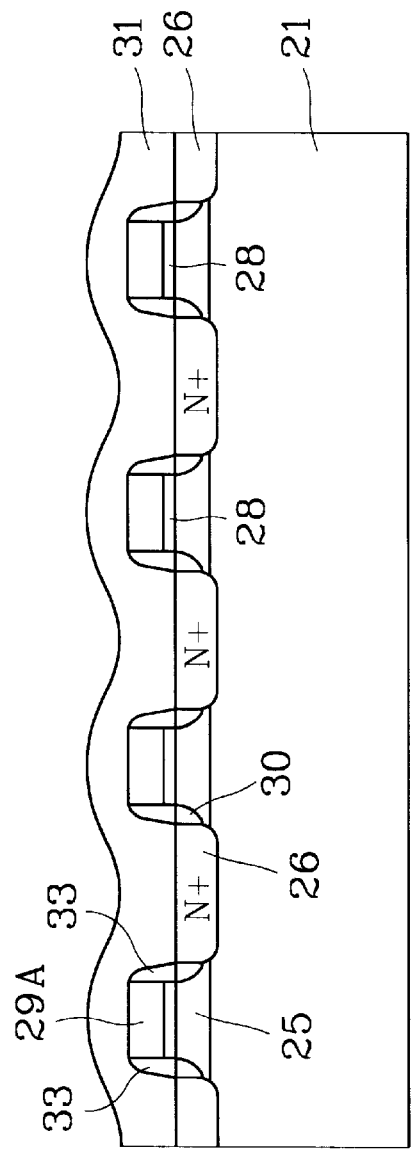
FIG. 3B shows a cross sectional view of the substrate cut from the active device region direction AA of FIG. 3A.

Referring now to FIG. 3, a gate oxide layer 28 and a polysilicon (or polycide) layer 29 are sequentially formed on the semiconductor substrate. The gate oxide layer and polysilicon layer are then patterned to define wordlines 29A and gates of the periphery devices. Next, $N^-$ lightly doped drains (NLDD)/PLDD regions 30, spacers 33, and $N^+/P^+$ source/drain regions 26 of the field effect transistors (FETs) are then formed. For simplicity, there are only four wordlines illustrated in the Figures. Next, an ILD layer 31 is deposited over the entire semiconductor substrate. Thereafter, the dielectric layer is planarized by thermal reflow, etchback or chemical mechanical polishing (CMP) techniques as shown in FIGS. 3(A) and 3(B). FIG. 3(B) is a cross sectional view of the semiconductor substrate cut from the active device region direction AA of FIG. 3(A). Finally, contact windows are defined and a metal layer (not shown in the Figures) is deposited and patterned to finish the basic ROM structure. These raw ROMs are stored in so-called passivation bank that only need to implant codes when an order is received to reduce the turn around time. This embodiment use a Mask ROM fabricating process as an example, however, other types of ROM array can also be manufactured by the process disclosed herein.

The polysilicon layer 27 is usually formed by in-situ phosphorus doped LPCVD method to obtain a thickness of between 1500 to 4500 Angstroms. The spacers 33 are usually made of oxide or nitride ($Si_3N_4$) by LPCVD technique also to a thickness of about 1000 to 3000 Angstroms. The ILD layer 31 is usually using boronphosphosilicate glass (BPSG) formed by atmosphere CVD (APCVD) technique to a thickness about 3000 to 8000 Angstroms. Alternatively, phosphosilicate glass (PSG), tetra-ethyl-ortho silicate (TEOS), or non-doped silicate glass (NSG) may also work as the dielectric layer. In accordance with the present invention, all of the circuits are well done except for the custom code (ROM code).

Figure 4A:
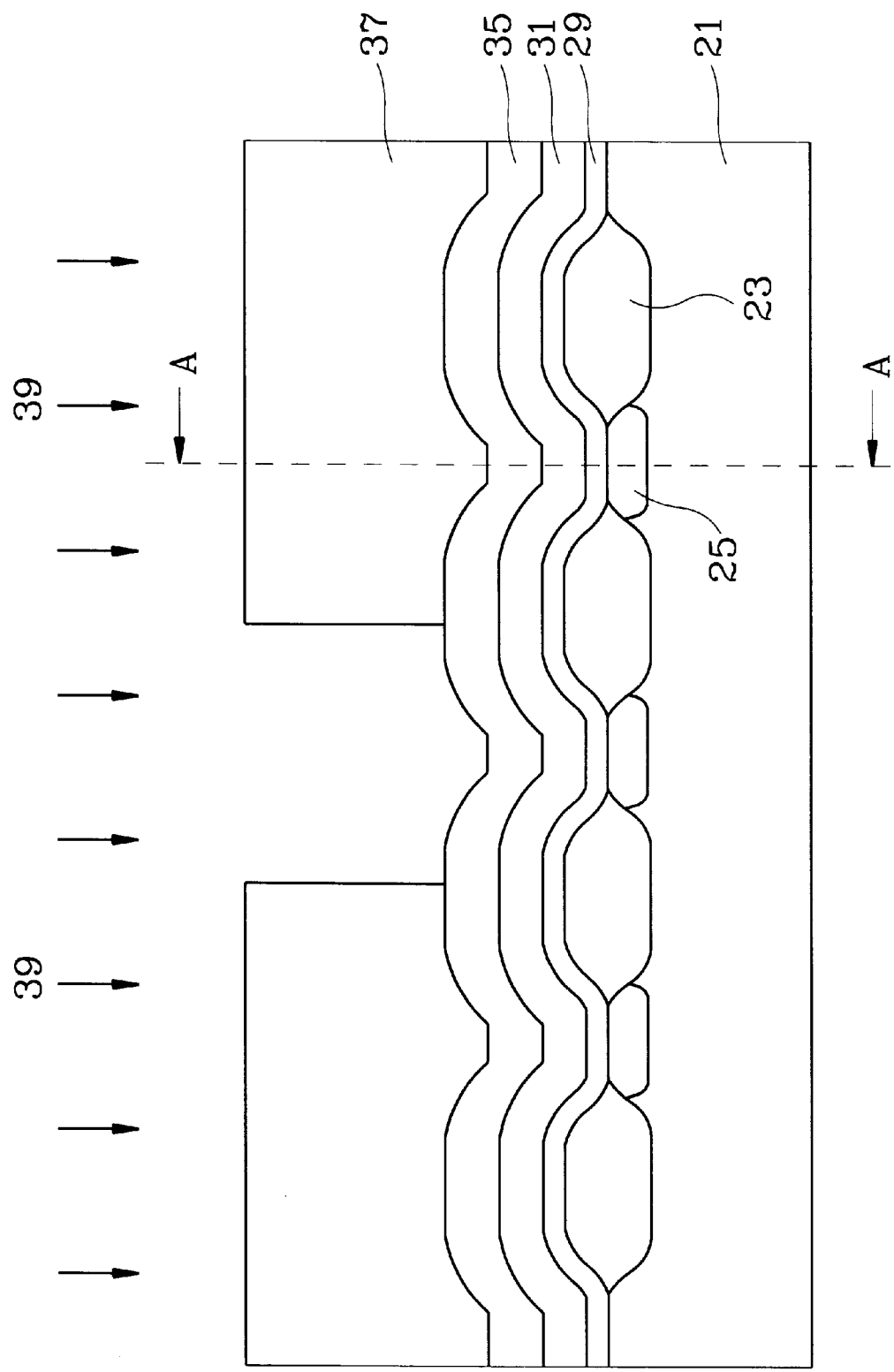
FIG. 4A shows a cross sectional representation of a substrate after the ROM code is implanted according to the present invention.
Figure 4B:
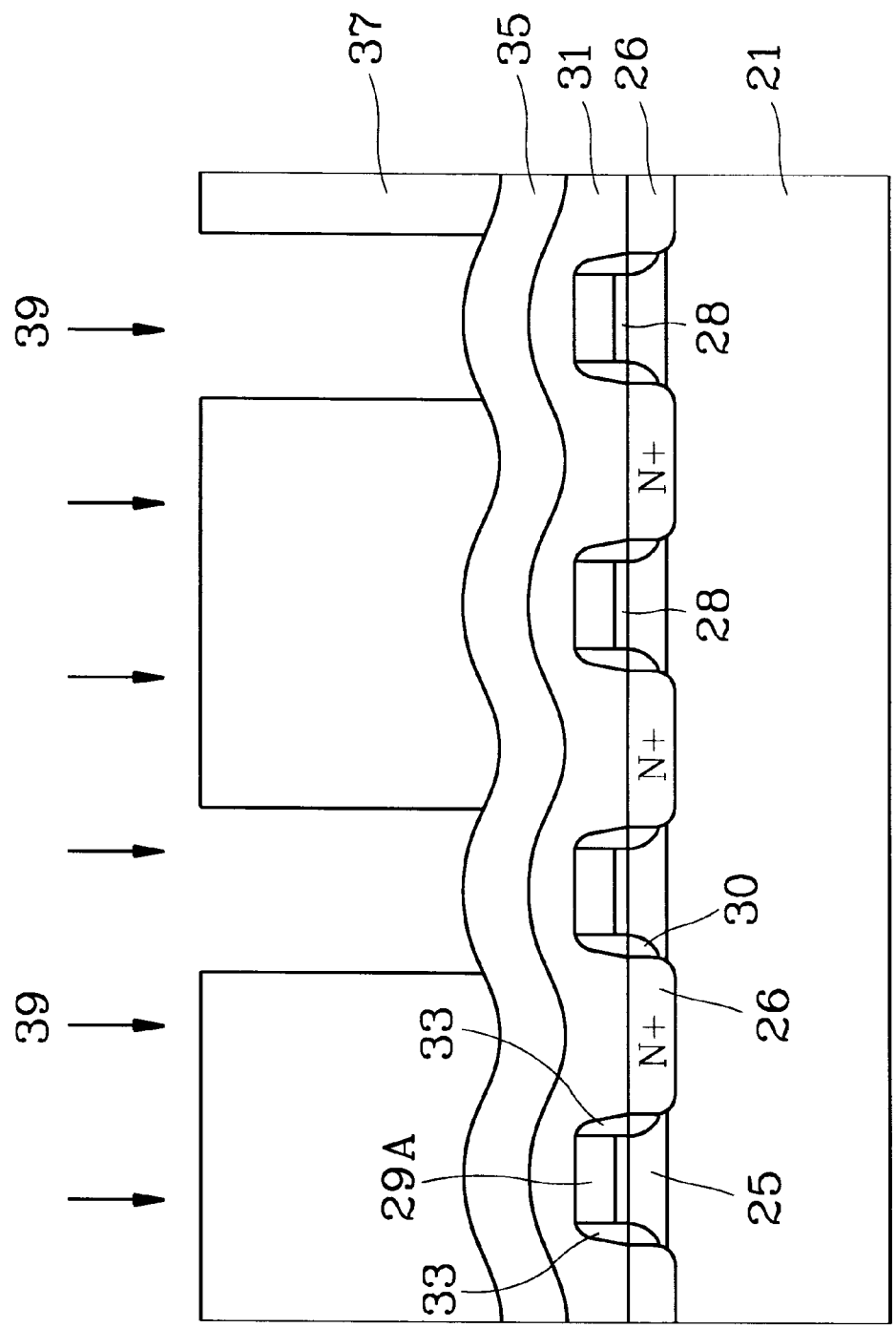
FIG. 4B shows a cross sectional view of the substrate cut from the active device region direction AA of FIG. 4A.

Referring now to FIG. 4, a passivation layer 35 is deposited overlaying the dielectric layer 31. Next, a photoresist layer 37 is coated over the passivation layer, and code implant windows are patterned by the conventional lithography techniques. Finally, neutron irradiation 39 is performed to activate the silicon isotopes into N-type phosphorus ions that achieves the code implanting as shown in FIGS. 4(A) and 4(B). FIG. 4(B) is also a cross sectional view of the semiconductor substrate cut from the active device region direction AA of FIG. 4(A). The easy and time saving ROM coding process according to the present invention is accomplished.

The passivation layer 35 is usually made of PECVD nitride ($Si_3N_4$) to a thickness of about 5000 to 10000 Angstroms. Alternatively, PECVD oxide or other types of oxide may also work. The photoresist layer 37 must be a type of photoresist that can either shield or absorb neutron irradiation without penetrating into the semiconductor substrate. Neutron irradiation 39 activates the silicon isotopes into N-type phosphorus ions is the key point of the present invention, the reaction equation is as following:

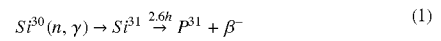

$$Si^{30}(n,\gamma) \to Si^{31} \stackrel{2.6h}{\to} P^{31} + \beta^- \qquad (1)$$

In the conventional cases the ROM turn around time requires several days or even several weeks. The ROM coding process according to the present invention can significantly reduce the ROM turn around time to only 1 or 2 days.

While the invention has been particularly shown and described with reference to a preferred embodiment, it will be understood by those skilled in the art that various changes in form and detail may be made therein without departing from the spirit and scope of the present invention.

What is claimed is:

1. A method of fabricating a read only memory (ROM) device, comprising the steps of:
   (a) forming well regions on a semiconductor substrate, and defining isolation and active regions;
   (b) forming isotope regions inside semiconductor substrate of said active regions;
   (c) sequentially forming a gate oxide layer and a polysilicon layer over the surface of said semiconductor substrate, and defining a plurality of polysilicon wordlines;
   (d) forming a plurality of field effect transistors of said ROM on said semiconductor substrate;
   (e) forming an interlayer dielectric layer over the entire semiconductor substrate, then defining contacts and depositing and patterning a metal layer;
   (f) forming a passivation layer overlaying said interlayer dielectric layer;
   (g) coating a photoresist layer overlaying said passivation layer, and defining coding windows; and
   (h) performing neutron irradiation to activate said isotopes into conduction impurities.

2. The method of claim 1, wherein said ROM is a mask ROM.

3. The method of claim 1, wherein said semiconductor substrate is silicon wafer.

4. The method of claim 1, wherein said isotope is silicon isotope ($Si^{30}$).

5. The method of claim 4, wherein said silicon isotope ($Si^{30}$) is implanted with an energy between 20 to 50 keV, and a dose between 1E12 to 1E15 $cm^{-2}$.

6. The method of claim 1, wherein said dielectric layer is boronphosphosilicate glass (BPSG).

7. The method of claim 1, wherein said passivation layer is selected from the group consisting of oxide and nitride.

8. The method of claim 1, wherein said photoresist layer can shield neutron irradiation without penetrating into said semiconductor substrate.

9. The method of claim 1, wherein said photoresist layer can absorb neutron irradiation without penetrating into said semiconductor substrate.

10. The method of claim 1, wherein said conduction impurities are n-type phosphorus ($P^{31}$) ions.

11. A method of fabricating a read only memory (ROM) device, comprising the steps of:
    (a) forming well regions on a semiconductor substrate, and defining isolation and active regions;
    (b) sequentially forming a gate oxide layer and a polysilicon layer over the surface of said semiconductor substrate, and defining a plurality of polysilicon wordlines;
    (c) forming a plurality of field effect transistors of said ROM on said semiconductor substrate;
    (d) forming an interlayer dielectric layer over the entire semiconductor substrate, then defining contacts and depositing and patterning a metal layer;
    (e) forming a passivation layer overlaying said interlayer dielectric layer;
    (f) coating a photoresist layer overlaying said passivation layer, and defining coding windows; and
    (g) performing neutron irradiation to activate the intrinsic isotopes inside said semiconductor substrate into conduction impurities.

12. The method of claim 11, wherein said ROM is a mask ROM.

13. The method of claim 11, wherein said semiconductor substrate is silicon wafer.

14. The method of claim 11, wherein said dielectric layer is boronphosphosilicate glass (BPSG).

15. The method of claim 11, wherein said passivation layer is selected from the group consisting of oxide and nitride.

16. The method of claim 11, wherein said photoresist layer can shield neutron irradiation without penetrating into said semiconductor substrate.

17. The method of claim 11, wherein said photoresist layer can absorb neutron irradiation without penetrating into said semiconductor substrate.

18. The method of claim 11, wherein said conduction impurities are n-type phosphorus ($P^{31}$) ions.

* * * * *